United States Patent
Yamashita

(10) Patent No.: US 7,855,434 B2
(45) Date of Patent: Dec. 21, 2010

(54) SEMICONDUCTOR DEVICE CAPABLE OF DECREASING VARIATIONS IN SIZE OF METAL RESISTANCE ELEMENT

(75) Inventor: Kimihiko Yamashita, Kobe (JP)

(73) Assignee: Ricoh Company, Ltd., Tokyo (JP)

( * ) Notice: Subject to any disclaimer, the term of this patent is extended or adjusted under 35 U.S.C. 154(b) by 450 days.

(21) Appl. No.: 12/055,947

(22) Filed: Mar. 26, 2008

(65) Prior Publication Data
US 2008/0237799 A1 Oct. 2, 2008

(51) Int. Cl.
*H01L 29/40* (2006.01)
(52) U.S. Cl. .................. 257/537; 257/538; 257/754; 257/E27.047
(58) Field of Classification Search ............. 257/537, 257/538, 754, E27.047
See application file for complete search history.

(56) References Cited

U.S. PATENT DOCUMENTS

| | | | |
|---|---|---|---|
| 6,940,128 B1 * | 9/2005 | Matsuki et al. | 257/341 |
| 7,180,091 B2 * | 2/2007 | Yamazaki et al. | 257/59 |
| 7,335,573 B2 * | 2/2008 | Takayama et al. | 438/455 |
| 2007/0210427 A1 * | 9/2007 | Lytle et al. | 257/678 |
| 2010/0109151 A1 * | 5/2010 | Fujimura et al. | 257/701 |

FOREIGN PATENT DOCUMENTS

| | | |
|---|---|---|
| JP | 2004-304068 | 10/2004 |
| JP | 2005-268317 | 9/2005 |
| JP | 2005-303051 | 10/2005 |

* cited by examiner

*Primary Examiner*—Ngan Ngo
(74) *Attorney, Agent, or Firm*—Cooper & Dunham LLP

(57) ABSTRACT

A semiconductor device is provided wherein a foundation insulating film is formed over a semiconductor substrate, a metal resistance element is formed on the foundation insulating film, and contacts are formed at both ends of the metal resistance element in a longitudinal direction of the metal resistance element and connected to the metal resistance element. The foundation insulating film comprises a single upwardly concave curved surface constituting not less than about 40 percent of an upper surface of the metal resistance element between the contacts in the longitudinal direction thereof. The curved surface of the foundation insulating film causes the metal resistance element to comprise a single upwardly concave curved surface constituting not less than about 40 percent of upper and lower surfaces of the metal resistance element between the contacts in the longitudinal direction thereof.

15 Claims, 12 Drawing Sheets

SEMICONDUCTOR DEVICE CAPABLE OF DECREASING VARIATIONS IN SIZE OF METAL RESISTANCE ELEMENT

BACKGROUND

1. Technical Field

The present specification relates to a semiconductor device, and more particularly, to a semiconductor device including a metal resistance element formed on a foundation insulating film and connected to contacts.

2. Discussion of the Background

In an analog integrated circuit, a resistance element is frequently used. Recently, the resistance element including a metal lamina, which is called a metal resistance element, draws increasing attention due to decreased temperature dependence of its resistance value.

In order to provide a highly integrated semiconductor device with increased resistance, many semiconductor devices include a thin metal resistance element with a thickness of about 500 Å or smaller.

One example of a related-art semiconductor device 50R including the metal resistance element is illustrated in FIGS. 1A to 1C, and FIG. 2. FIG. 1A is a plan view of the related-art semiconductor device 50R illustrating a position of formation of the metal resistance element. FIG. 1B is a sectional view of the related-art semiconductor device 50R along a line X-X shown in FIG. 1A. FIG. 1C is a sectional scanning ion microscope image of the related-art semiconductor device 50R shown in FIG. 1B.

As illustrated in FIG. 1B, on a silicon substrate 1R is provided an element separation oxidation film 3R. An interlayer insulating film 5R, a TEOS (tetra ethyl ortho silicate) film 11R, and a TEOS film 13R are sequentially formed thereon. On the TEOS film 13R are provided metal film patterns 15R to be connected to a metal resistance element 27R. A TiN (titanium nitride) film 17R is formed on the metal film pattern 15R.

Also, a TEOS film 19R and a TEOS film 23R are provided on the TEOS film 13R while covering the metal film pattern 15R, and have plane surfaces between the metal film patterns 15R.

Contact holes 25R are formed in the TEOS films 19R and 23R at positions corresponding to both ends of the metal resistance element 27R in a longitudinal direction of the metal resistance element 27R.

The metal resistance element 27R is provided on the TEOS film 23R and in the contact hole 25R and extends from an area between the contact holes 25R to an area in the contact holes 25R and above the metal film patterns 15R. Both ends of the metal resistance element 27R are electrically connected to the TiN films 17R and the metal film patterns 15R in the contact holes 25R.

A protection film 29R is provided on the TEOS film 23R and the metal resistance element 27R.

FIG. 2 is a schematic view of the related-art semiconductor device 50R during exposure of a resist film 33AR to light in order to form a resist film pattern for defining a formation of the metal resistance element 27R.

When the light is incident from a surface of the resist film 33AR as indicated by a downward arrow in FIG. 2 and passes through a CrSi film 27AR for forming the metal resistance element 27R and the TEOS films 23R, 19R, 13R and 11R, some of the incident light may be absorbed into the films or reflected as indicated by upward arrows in FIG. 2.

Generally, reflection of light occurs on interfaces between two substances having different indexes of refraction. Since the related-art semiconductor device 50R includes the various interlayer insulating films, reflection of light may repeatedly occur, which is called multiple reflections. For example, some of the incident light reflected on one interface may be reflected on another interface.

After the multiple reflections, some of the reflected light returning to a surface of the CrSi film 27AR interferes with the light reflected on the surface of the CrSi film 27AR and the incident light to generate a standing wave in the resist film 33AR. The standing wave generated by the reflected light and the incident light may affect patterning for forming the resist film pattern, that is, intensity of the standing wave may change a size of the resist film pattern.

Additionally, differences in thickness and quality (e.g., index of refraction, or the like) between the films may directly affect intensity of the light reflected on the interfaces between the respective films and the standing wave generated by the reflected light, resulting in substantial variations in the size of the resist film pattern for defining the formation of the metal resistance element 27R.

The variations in the size of the resist film pattern may vary a size of the metal resistance element 27R, resulting in a large variation in a resistance value of the metal resistance element 27R.

BRIEF SUMMARY

This patent specification describes a semiconductor device, one example of which includes a semiconductor substrate, a foundation insulating film, a metal resistance element, and contacts. The foundation insulating film is formed over the semiconductor substrate. The metal resistance element is formed on the foundation insulating film. The contacts are formed at both ends of the metal resistance element in a longitudinal direction of the metal resistance element and connected to the metal resistance element. The foundation insulating film comprises a single upwardly concave curved surface constituting not less than about 40 percent of an upper surface of the metal resistance element between the contacts in the longitudinal direction of the metal resistance element. The curved surface of the foundation insulating film causes the metal resistance element to comprise a single upwardly concave curved surface constituting not less than about 40 percent of upper and lower surfaces of the metal resistance element between the contacts in the longitudinal direction of the metal resistance element.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EXEMPLARY EMBODIMENTS

Figure 1A:
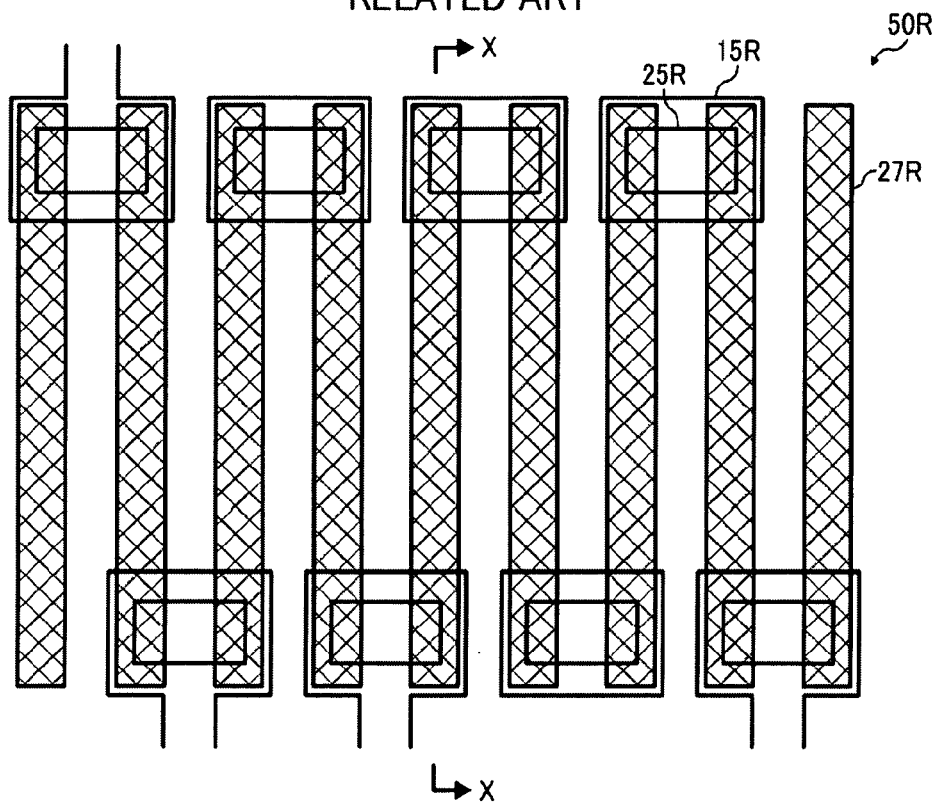
FIG. 1A is a plan view of a related-art semiconductor device.
Figure 1B:
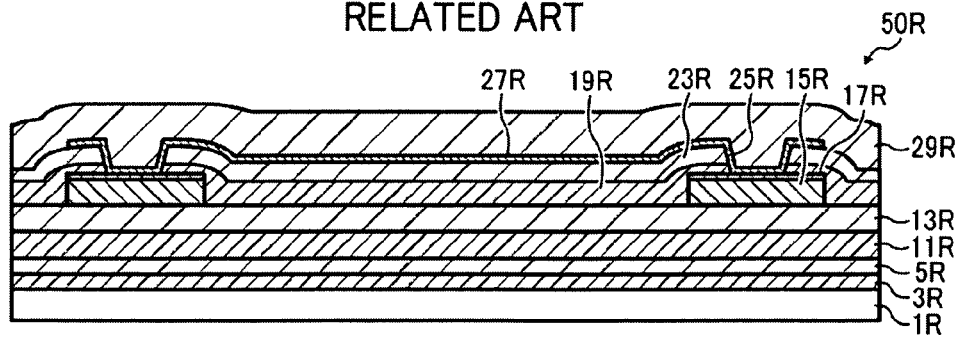
FIG. 1B is a sectional view of the related-art semiconductor device along a line X-X shown in FIG. 1A.
Figure 1C:
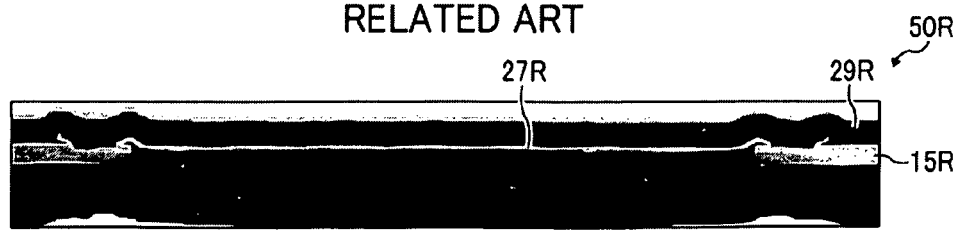
FIG. 1C is a sectional scanning ion microscope image of the related-art semiconductor device shown in FIG. 1B.

In describing examples and exemplary embodiments illustrated in the drawings, specific terminology is employed for the sake of clarity. However, this disclosure is not intended to be limited to the specific terminology so selected and it is to be understood that each specific element includes all technical equivalents that operate in a similar manner and achieve a similar result.

Figure 3A:
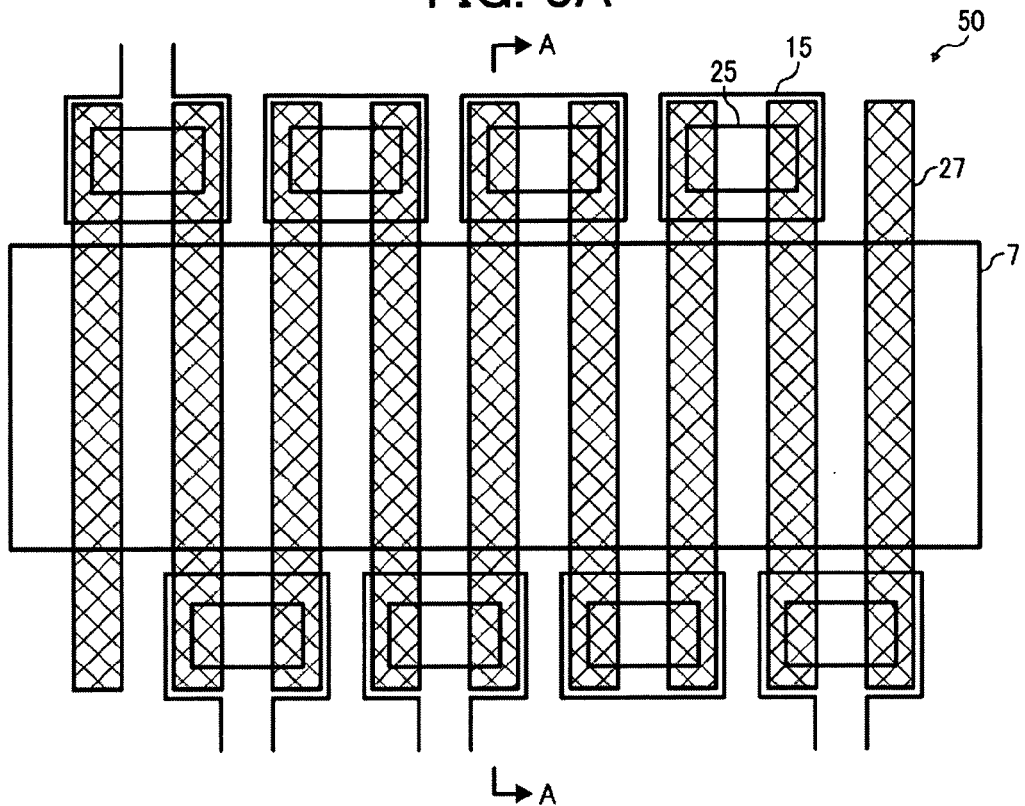
FIG. 3A is a plan view of a semiconductor device according to an exemplary embodiment of the present disclosure.
Figure 3B:
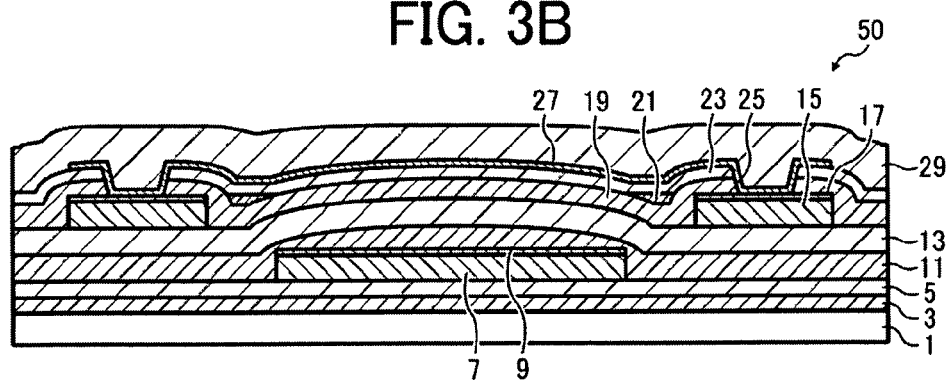
FIG. 3B is a sectional view of the semiconductor device along a line A-A shown in FIG. 3A.
Figure 3C:
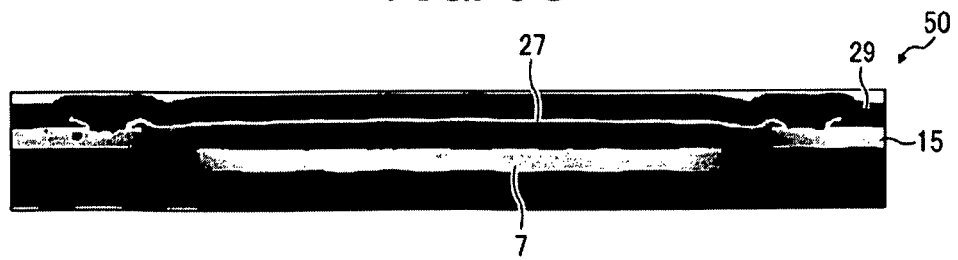
FIG. 3C is a sectional scanning ion microscope image of the semiconductor device shown in FIG. 3B.

Referring now to the drawings, wherein like reference numerals designate identical or corresponding parts throughout the several views, in particular to FIGS. 3A to 3C, a semiconductor device 50 according to an exemplary embodiment is described.

FIG. 3A is a plan view of the semiconductor device 50. FIG. 3B is a sectional view of the semiconductor device 50 along a line A-A shown in FIG. 3A. FIG. 3C is a sectional scanning ion microscope image of the semiconductor device 50 shown in FIG. 3B.

As illustrated in FIG. 3B, the semiconductor device 50 includes a silicon substrate 1, an element separation oxidation film 3, an interlayer insulating film 5, metal film patterns 7 and 15, TiN (titanium nitride) films 9 and 17, TEOS (tetra ethyl ortho silicate) films 11, 13, 19, and 23, a SOG (spin on glass) film 21, a contact hole 25, a metal resistance element 27, and a protection film 29.

The element separation oxidation film 3 is formed on the silicon substrate 1, serving as a semiconductor substrate. The interlayer insulating film 5 includes a BPSG (borophospho silicate glass) film or a PSG (phosphor silicate glass) film, and is formed on the element separation oxidation film 3.

On the interlayer insulating film 5 is provided the metal film pattern 7 as a first metal wiring layer, including an AlSiCu film, for example. Provision of the metal film pattern 7 causes the TEOS film 23, serving as a foundation insulating film, and the metal resistance element 27 to be curved. The TiN film 9 is formed on the metal film pattern 7. The TiN film 9 may include other high melting point metal such as Ti, TiW, Wsi, W, or the like. Alternatively, no TiN film 9 may be provided, or the metal film pattern 7 may include high melting point metal.

Subsequently, the TEOS film 11 and the TEOS film 13 are laminated on the interlayer insulating film 5 to form an interlayer insulating film while covering the metal film pattern 7. An upper surface of the TEOS film 11 is planarized but convexly curved in a cross-section direction above the metal film pattern 7. The curved upper surface of the TEOS film 11 causes the TEOS film 13 to have a curved upper surface.

On the interlayer insulating film 13 are provided the metal film patterns 15 serving as a second metal wiring layer, including an AlSiCu film, for example. The metal film patterns 15 are disposed at positions corresponding to both ends of the metal resistance element 27 in a longitudinal direction of the metal resistance element 27 and contact the metal resistance element 27, respectively. The TiN film 17 is formed on an upper surface of the metal film pattern 15. The TiN film 17 may include high melting point metal such as Ti, TiW, Wsi, W, or the like. Alternatively, no TiN film 17 may be provided or the metal film pattern 15 may include high melting point metal.

The TEOS film 19, the SOG film 21, and the TEOS film 23, serving as a foundation insulating film, are sequentially laminated on the TEOS film 13 to form an interlayer insulating film, while covering the metal film pattern 15. Due to the curved upper surface of the TEOS film 13 caused by the metal film pattern 7, the TEOS films 19 and 23 are caused to have curved upper surfaces in the cross-section direction above the metal film pattern 7.

The contact holes 25, serving as contacts, are formed in the TEOS films 19 and 23 above the metal film patterns 15 at the positions corresponding to both ends of the metal resistance element 27 in the longitudinal direction thereof, respectively.

The metal resistance element 27 is formed on the TEOS film 23 and inside the contact holes 25 and extends from an area between the contact holes 25 to areas in the contact holes 25 and above the metal film patterns 15. The metal resistance element 27 includes a CrSi film. Both ends of the metal resistance element 27 in the longitudinal direction thereof are electrically connected to the TiN films 17 and the metal film patterns 15 in the contact holes 25, respectively.

The metal resistance element 27 includes a curved surface upwardly convex, constituting a part of the upper and lower surfaces between the contact holes 25 in the longitudinal direction thereof.

The protection film 29 is formed on the TEOS film 23 and the metal resistance element 27.

Referring to FIGS. 4A to 4D, 5A to 5D, 6A to 6D, and 7, a description is now given of production processes 1 to 12 of the semiconductor device 50 according to the exemplary embodiment. FIGS. 4A to 4D, 5A to 5D, and 6A to 6D are sectional views of the semiconductor device 50 illustrating respective stages of a production process thereof.

Figure 4A:
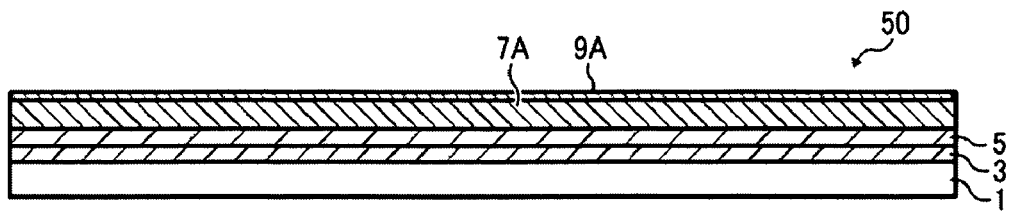
FIG. 4A is a sectional view of the semiconductor device shown in FIG. 3B in a stage of a production process.

FIG. 4A illustrates a production process stage S1. The element separation oxidation film 3 with a thickness of about 6,000 Å is formed on the silicon substrate 1. After a polysilicon film pattern, not shown, for a gate electrode of a MOS (metal oxide semiconductor) transistor is formed, the interlayer insulating film 5 including a BPSG film with a thickness of about 8,000 Å is formed. An AlSiCu film 7A with a thickness of about 7,000 Å and a TiN film 9A with a thickness of about 300 Å are sequentially formed thereon.

Figure 4B:
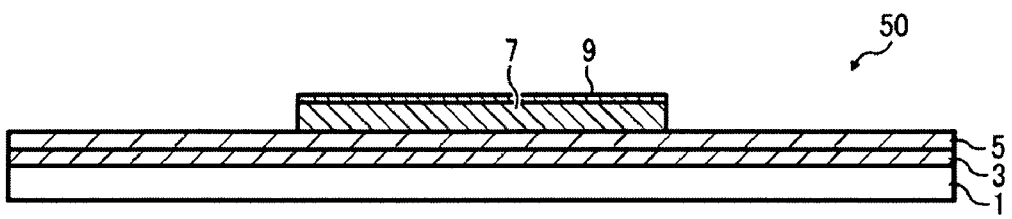
FIG. 4B is a sectional view of the semiconductor device shown in FIG. 3B in a subsequent stage of the production process.

FIG. 4B illustrates a production process stage S2. By using a known photo engraving technique and an etching technique, patterning of the TiN film 9A and the AlSiCu film 7A (depicted in FIG. 4A) is performed to form the metal film pattern 7 and the TiN film 9 in an area below the metal resistance element 27 to be formed later.

Figure 4C:
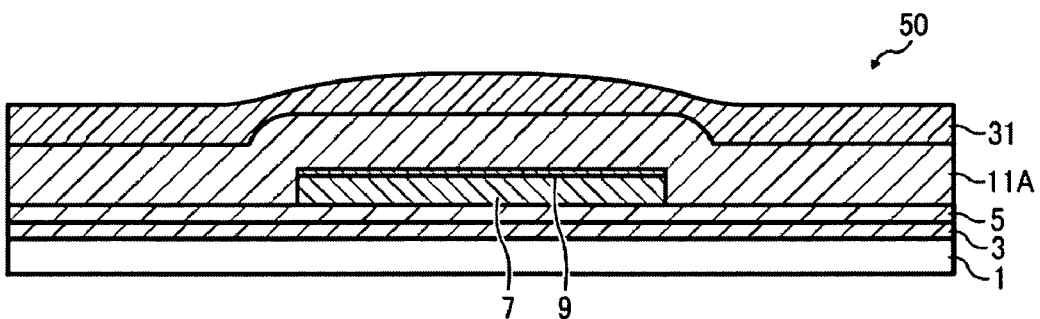
FIG. 4C is a sectional view of the semiconductor device shown in FIG. 3B in a subsequent stage of the production process.

FIG. 4C illustrates a production process stage S3. A TEOS film 11A with a thickness of about 5,000 Å is formed on a whole surface of the above films, that is, the interlayer insulating film 5, the metal film pattern 7, and the TiN film 9. A SOG film 31 with a thickness of about 4,000 Å is formed on the TEOS film 11A. When the SOG film 31 is applied to the surface of the TEOS film 11A, the SOG film 31 has a curved shape above the metal film pattern 7 in a large area from a center of the metal film pattern 7 to a periphery thereof due to its characteristic.

Figure 7:
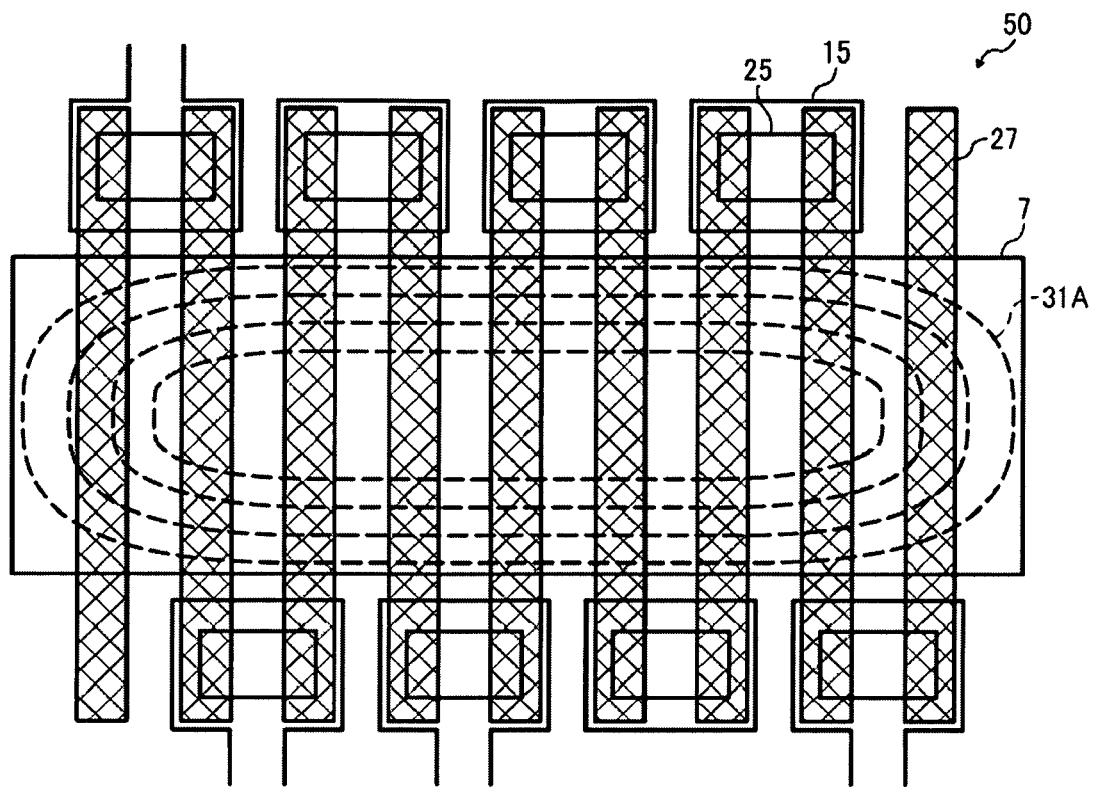
FIG. 7 is a plan view of the semiconductor device shown in FIG. 4C, illustrating a film thickness distribution of a SOG (spin on glass) film.

FIG. 7 is a plan view of the semiconductor device 50 illustrating a film thickness distribution of the SOG film 31 represented by contour lines 31A. The SOG film 31 applied to the periphery of the metal film pattern 7 has a thin thickness, while the SOG film 31 applied to the center of the metal film pattern 7 is as thick as that applied to a flat surface around the center of the metal film pattern 7. Therefore, the thickness of the SOG film 31 varies as shown by the contour lines 31A. Thus, the SOG film 31 has a curved surface above and across the metal film pattern 7 and the periphery thereof in the cross-section direction.

Figure 4D:
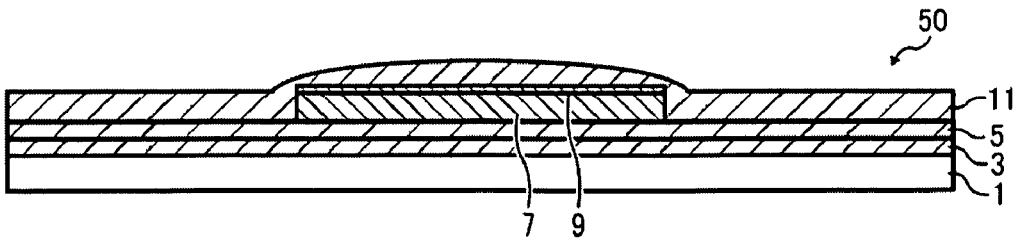
FIG. 4D is a sectional view of the semiconductor device shown in FIG. 3B in a subsequent stage of the production process.

FIG. 4D illustrates a production process stage S4.

Etch-back of the SOG film 31 and the TEOS film 11A (depicted in FIG. 4C) is performed by using an anisotropic etch method in order to ensure wiring reliability. A surface shape of the SOG film 31 is transferred to the TEOS film 11A, so that the TEOS film 11 has a curved surface. A parallel flat plate plasma etching machine etches the TEOS film 11A of an amount of 5,750 Å under conditions of pressure of 1,700 mTorr, RF power of 600 W, Ar flow rate of 1,000 sccm, CHF$_3$ flow rate of 47 sccm, and CF$_4$ flow rate of 53 sccm. Since the etch-back of the SOG film 31 is performed by the anisotropic etch method in order to planarize the SOG film 31, the curved surface of the SOG film 31 may be transferred to the surface of the TEOS film 11. According to the present exemplary embodiment, the etch-back is performed until the whole SOG film 31 is removed. However, the SOG film 31 may remain on a portion forming a step or the whole surface of the TEOS film 11. Alternatively, no etch-back may be performed so as to cause the whole SOG film 31 to remain on the TEOS film 11.

Figure 5A:
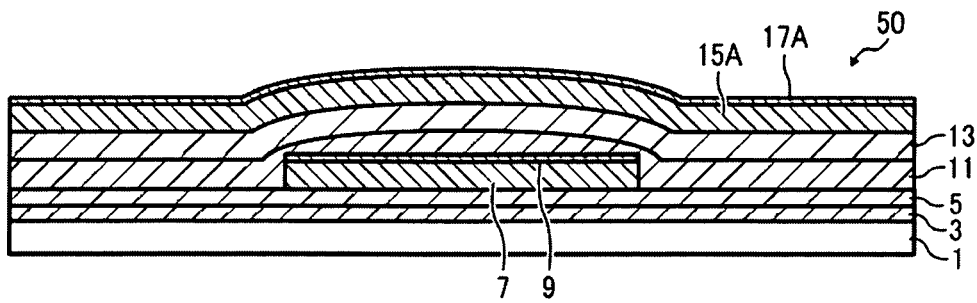
FIG. 5A is a sectional view of the semiconductor device shown in FIG. 3B in a subsequent stage of the production process.

FIG. 5A illustrates a production process stage S5. In order to ensure further wiring reliability, the TEOS film 13 with a thickness of about 4,000 Å is formed on the TEOS film 11. The curved surface of the TEOS film 11 causes the TEOS film 13 to have a curved upper surface. After an AlSiCu film 15A with a thickness of about 7,000 Å serving as the second metal wiring layer is formed on the TEOS film 13, a TiN film 17A with a thickness of about 300 Å is formed thereon.

Figure 5B:
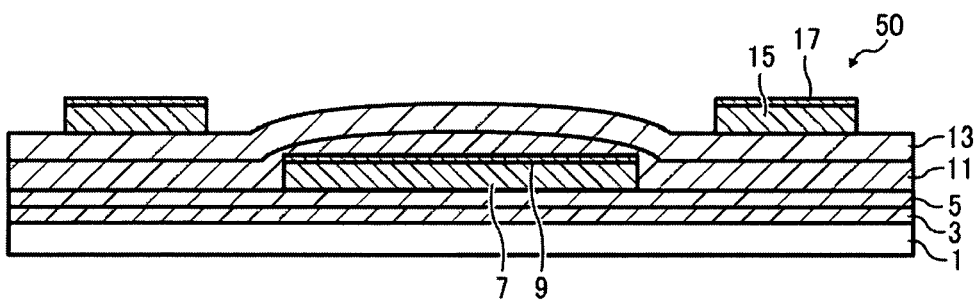
FIG. 5B is a sectional view of the semiconductor device shown in FIG. 3B in a subsequent stage of the production process.

FIG. 5B illustrates a production process stage S6. By using the known photo engraving technique and the etching technique, patterning of the TiN film 17A and the AlSiCu film 15A (depicted in FIG. 5A) is performed to form the metal film pattern 15 to be used as an electrode of the metal resistance element 27 (depicted in FIG. 7) and the TiN film 17.

Figure 5C:
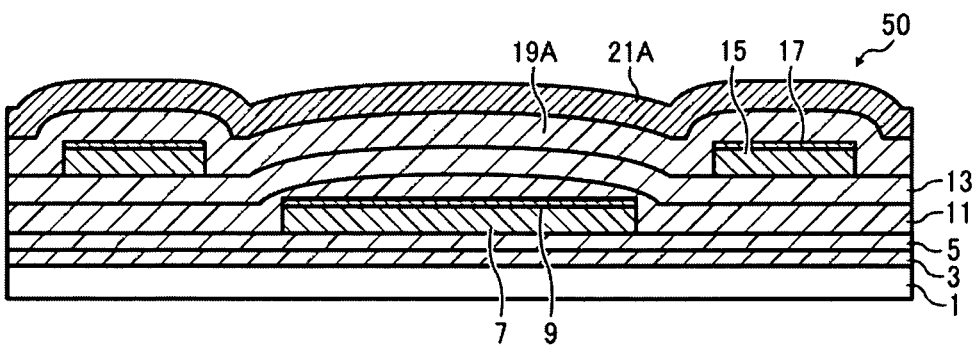
FIG. 5C is a sectional view of the semiconductor device shown in FIG. 3B in a subsequent stage of the production process.

FIG. 5C illustrates a production process stage S7. A TEOS film 19A with a thickness of about 5,000 Å is formed on the whole surfaces of the TEOS film 13, the metal film pattern 15, and the TiN film 17. A SOG film 21A with a thickness of about 4,000 Å is formed on the TEOS film 19A. Although the SOG film 21A has a characteristic of being thickly applied to a steep step, the TEOS film 13 has a gently curved upper surface, and thus a small degree of planarization of the curved upper surface of the TEOS film 13 is performed by the SOG film 21A. Therefore, the SOG film 21A maintains a curved upper surface corresponding to the curved upper surface of the TEOS film 13.

Figure 5D:
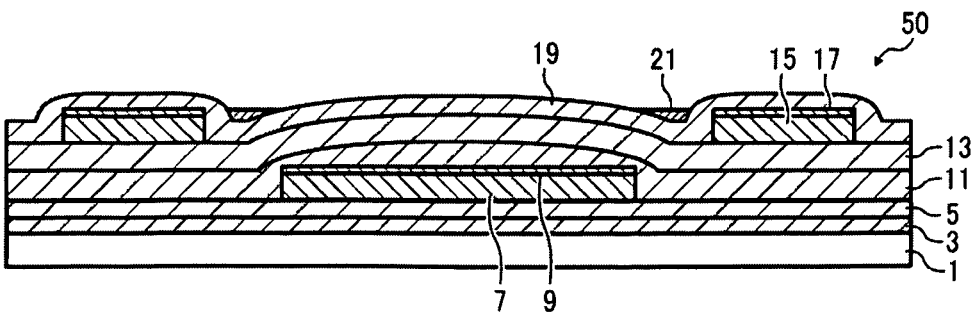
FIG. 5D is a sectional view of the semiconductor device shown in FIG. 3B in a subsequent stage of the production process.

FIG. 5D illustrates a production process stage S8. In order to ensure wiring reliability, etch-back of the SOG film 21A and the TEOS film 19A (depicted in FIG. 5C) is performed by using the anisotropic etching method, so that the SOG film 21 and the TEOS film 19 are formed. The anisotropic etching causes the TEOS film 19 to have a curved upper surface.

Figure 6A:
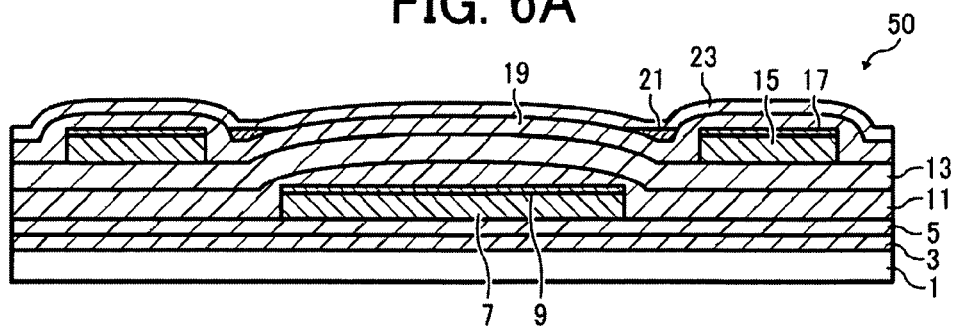
FIG. 6A is a sectional view of the semiconductor device shown in FIG. 3B in a subsequent stage of the production process.

FIG. 6A illustrates a production process stage S9. In order to ensure further wiring reliability, the TEOS film 23 with a thickness of about 2,500 Å is formed on the TEOS film 19 and the SOG film 21. The curved upper surface of the TEOS film 19 causes the TEOS film 23 to have a curved upper surface.

Figure 6B:
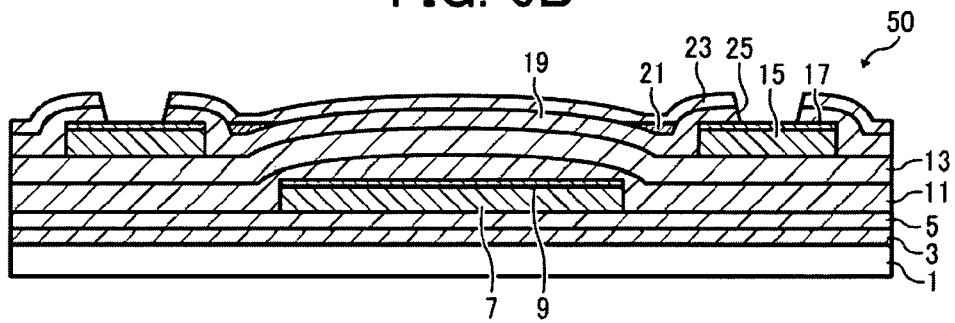
FIG. 6B is a sectional view of the semiconductor device shown in FIG. 3B in a subsequent stage of the production process.

FIG. 6B illustrates a production process stage S10. By using the known photo engraving technique and the etching technique, the contact hole 25 is provided in the TEOS film 23 and the TEOS film 19 formed on the metal film pattern 15.

Figure 6C:
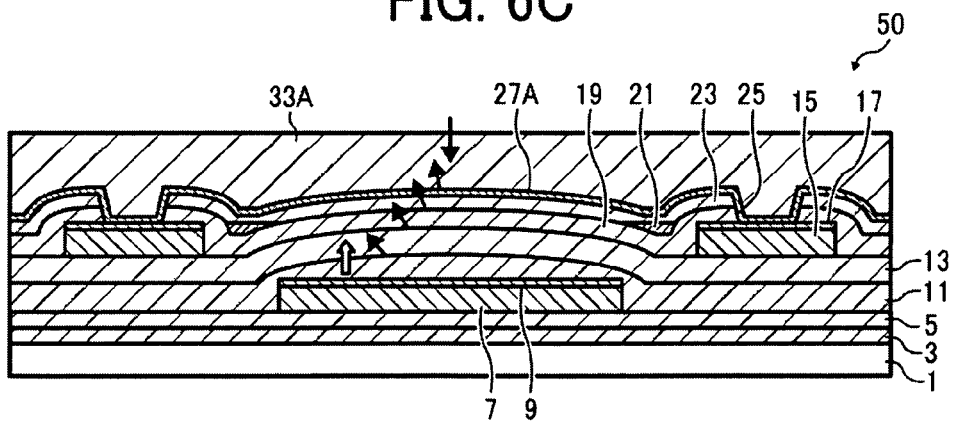
FIG. 6C is a sectional view of the semiconductor device shown in FIG. 3B in a subsequent stage of the production process.

FIG. 6C illustrates a production process stage S11. A CrSi film 27A with a thickness of about 100 Å for forming the metal resistance element 27 (depicted in FIG. 7) is provided on the TEOS film 23 and in the contact hole 25. The curved upper surface of the TEOS film 23 causes the CrSi film 27A to have curved upper and lower surfaces. A resist film 33A is formed on the CrSi film 27A and exposed by using a photo mask for defining a formation of the metal resistance element 27.

Figure 2:
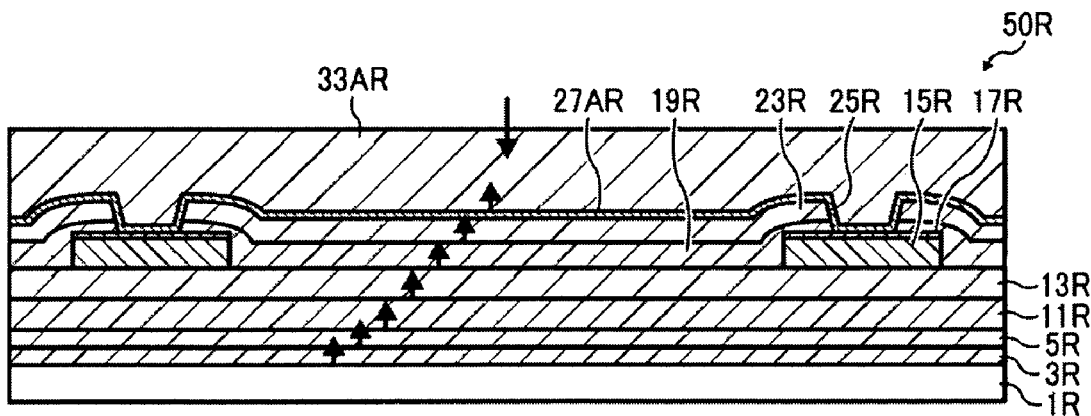
FIG. 2 is a sectional view of the related-art semiconductor device shown in FIG. 1B in exposure processing.

Unlike the CrSi film 27AR in the related-art semiconductor device 50R (depicted in FIG. 2), since the CrSi film 27A of the semiconductor device 50 has the curved upper and lower surfaces, when exposed light is reflected on the upper surface of the CrSi film 27A, it may scatter as indicated by an arrow in FIG. 6C, thereby preventing a standing wave from being generated by incident light and reflected light in the resist film 33A.

Further, since interfaces between the CrSi film 27A and the TEOS film 23, between the TEOS films 23 and 19, between the TEOS films 19 and 13, and between the TEOS films 13 and 11 also have curved surfaces, light reflected on the surfaces may scatter, thereby preventing generation of a standing wave in the resist film 33A.

Additionally, due to an effect of the TiN film 9 provided below the CrSi film 27A, an amount of light reflected on the surface of the TiN film 9 may be substantially reduced, and thereby generation of the standing wave may be further prevented. Moreover, provision of the TiN film 9 and the metal film pattern 7 may prevent light from reflecting on interfaces between the films provided below the metal film pattern 7, and thereby variations in thickness and reflectivity of the films may not affect intensity of the standing wave.

Figure 6D:
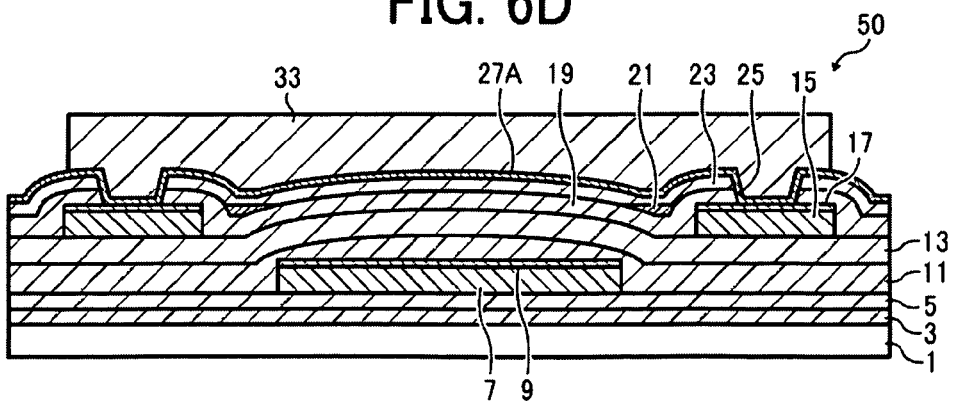
FIG. 6D is a sectional view of the semiconductor device shown in FIG. 3B in a subsequent stage of the production process.

FIG. 6D illustrates a production process stage S12. After being exposed, the resist film 33A (depicted in FIG. 6C) is developed and cleaned, so as to form a resist film pattern 33. As described above, prevention of generation of the standing wave in the resist film 33A performed during the exposure processing may cause the resist film pattern 33 to be precisely formed.

FIG. 3B illustrates a production process stage S13. By the known etching technique, patterning of the CrSi film 27A (depicted in FIG. 6D) is performed by using the resist film pattern 33 (depicted in FIG. 6D) as a mask, so as to form the metal resistance element 27. Thereafter, the resist film pattern 33 is removed.

Therefore, by preventing generation of the standing wave in the resist film 33A (depicted in FIG. 6C) during the exposure processing, both the resist film pattern 33 and the metal resistance element 27 may be properly formed, thereby decreasing variations in size of the metal resistance element 27.

Figure 8:
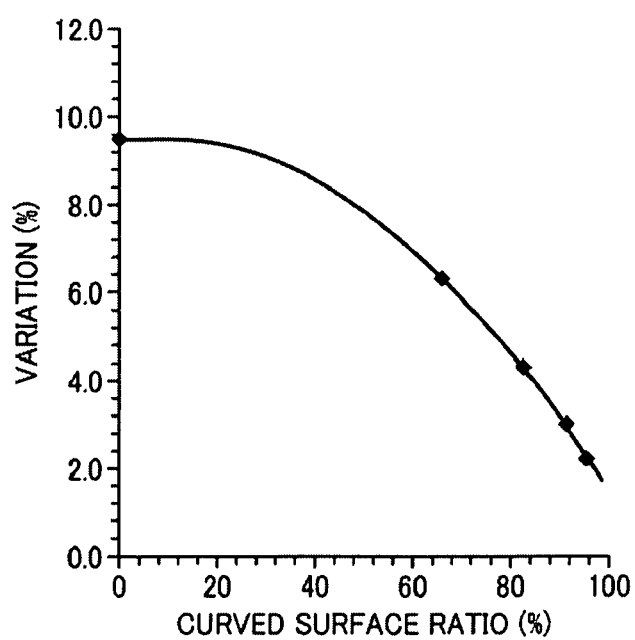
FIG. 8 is a graph illustrating a relationship between a curved surface ratio and variations in resistance values.
Figure 9:
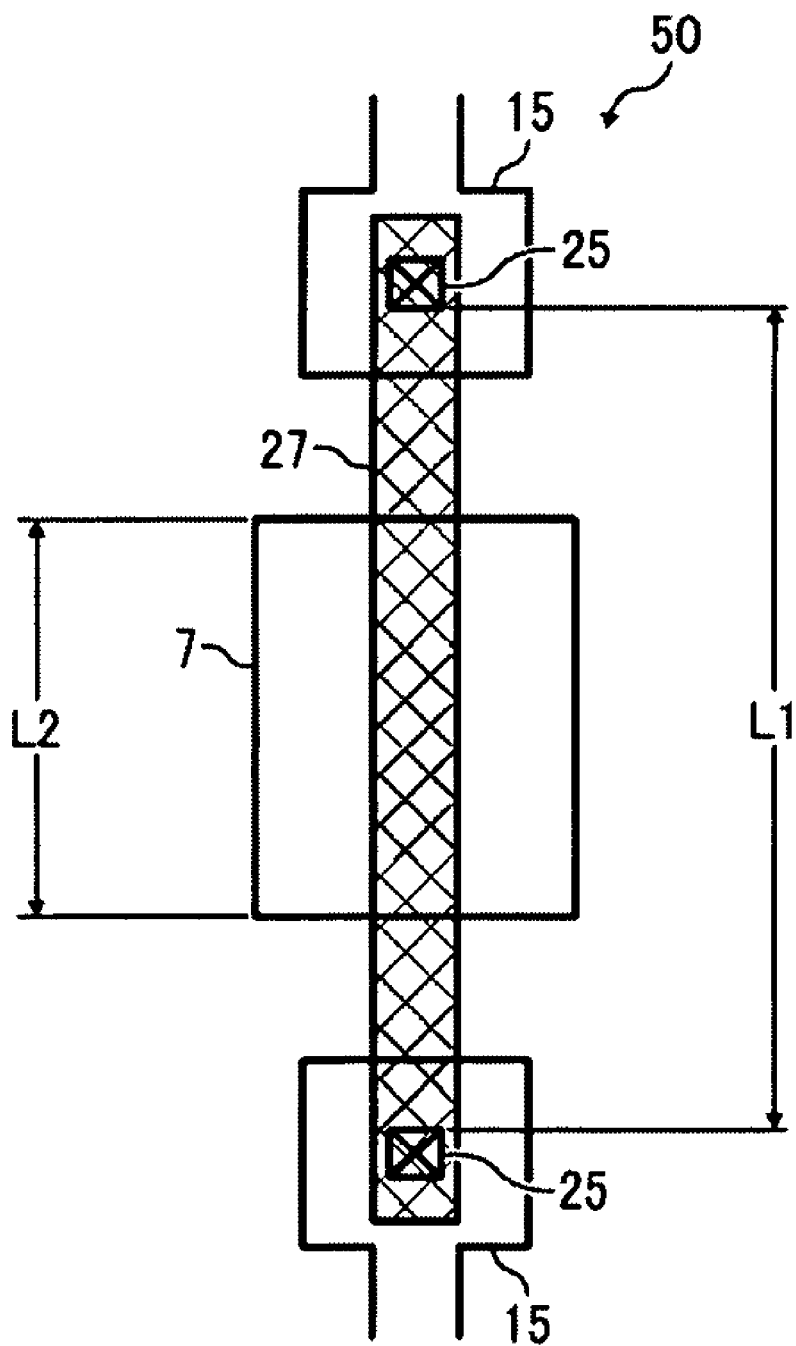
FIG. 9 is a partial plan view of the semiconductor device shown in FIG. 3B, illustrating a method of calculation of the curved surface ratio shown in FIG. 8.

A measurement of a resistance value of the metal resistance element 27 was performed. FIG. 8 is a graph illustrating a relationship between a ratio (e.g., a curved surface ratio) of length of a curved surface area to resistance length of the metal resistance element 27 and variations in resistance values. FIG. 9 is a plan view of the metal resistance element 27 and the metal film pattern 7 illustrating a method of calculation of the curved surface ratio. The curved surface ratio is obtained by a following formula (1):

$$L2 \div L1 \times 100\% \quad (1)$$

where L1 represents a length of the metal resistance element 27, and L2 represents a length of the metal film pattern 7. A sample of the metal resistance element 27 used in the measurement had a width of 1.2 μm, and other dimensions thereof were equivalent to those described in the above production processes of the semiconductor device 50. Table 1 shows a measurement result thereof.

TABLE 1

| L1 (μm) | L2 (μm) | Curved surface ratio (%) | Variation (%) |
|---|---|---|---|
| 40 | 0.0 | 0.0 | 9.5 |
| 10 | 6.6 | 66.0 | 6.3 |
| 20 | 16.6 | 83.0 | 4.3 |
| 40 | 36.6 | 91.5 | 3.0 |
| 80 | 76.6 | 95.8 | 2.2 |

FIG. 8 and Table 1 indicate that the variations in resistance values substantially decrease as the curved surface ratio increases. In particular, as illustrated in FIG. 8, when the metal resistance element 27 has a curved surface ratio of about 40 percent or higher, or preferably about 66 percent or higher, the variations in resistance values due to a difference in intensity of light reflected on the films provided below the metal resistance element 27 may be reduced.

Figure 10A:
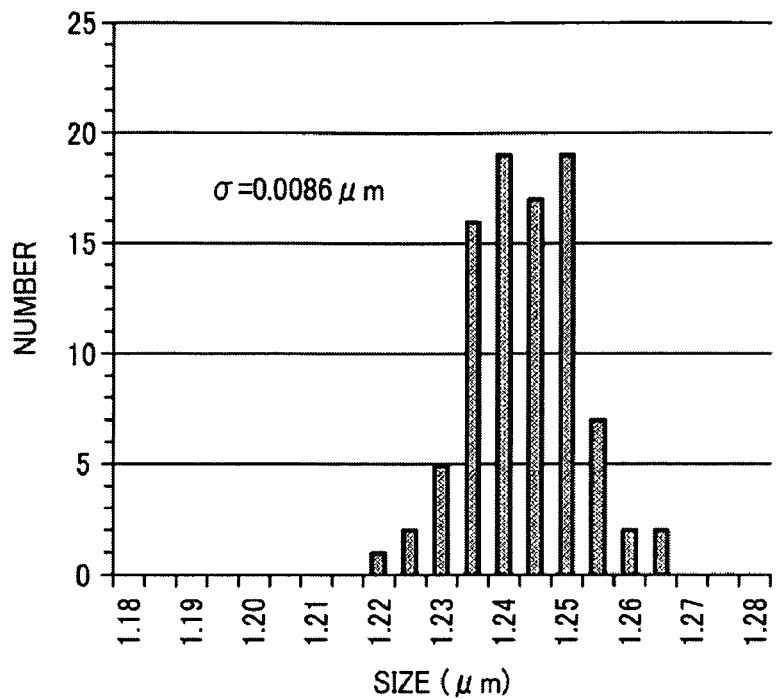
FIG. 10A is a graph illustrating a result of a measurement of size of a resist film pattern in a semiconductor device including a metal resistance element having a curved surface.
Figure 10B:
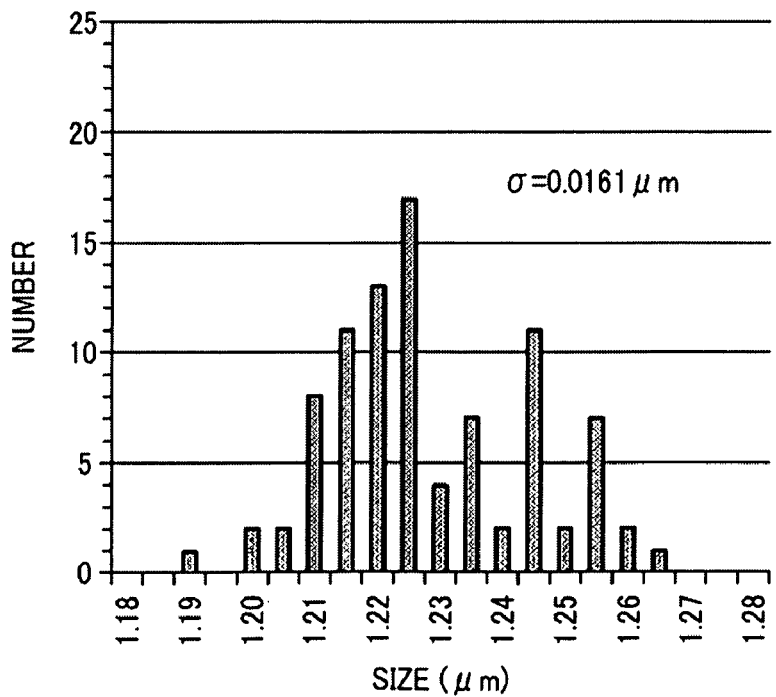
FIG. 10B is a graph illustrating a result of a measurement of size of a resist film pattern in a related-art semiconductor device including a metal resistance element not having a curved surface.

A measurement of size of a resist film pattern was performed in order to examine variations in size thereof. FIG. 10A is a graph illustrating a measurement result in a semiconductor device A (e.g., the semiconductor device 50 depicted in FIG. 3B) including a metal resistance element (e.g., the metal resistance element 27 depicted in FIG. 3B) having a curved surface. FIG. 10B is a graph illustrating a measurement result in a related-art semiconductor device B including a metal resistance element not having a curved surface. By using a sample of a resist film pattern for forming 85 metal resistance elements with a resistance width of 1.2 μm and a resistance length of 58 μm spaced 2.2 μm apart from each other, size of the resist film patterns corresponding to the $2^{nd}$, $12^{th}$, $22^{nd}$, $32^{nd}$, $42^{nd}$, $52^{nd}$, $62^{nd}$, $72^{nd}$, and $82^{nd}$ metal resistance elements from an end of the 85 metal resistance elements in a direction in which the metal resistance elements are arranged was measured. The above 9 measurements on 5 points on two wafers, totaling 90 measurements were performed in the semiconductor device A. Provision of a metal film pattern with a length of 54.6 μm below the metal resistance elements caused the surface of the metal resistance elements to be curved. The above sample was produced under conditions equivalent to those described in the above production processes of the semiconductor device 50.

As is clear from the graphs in FIGS. 10A and 10B, the resist film pattern of the semiconductor device A has about half as many variations in size as the resist film pattern of the semiconductor device B.

Figure 11:
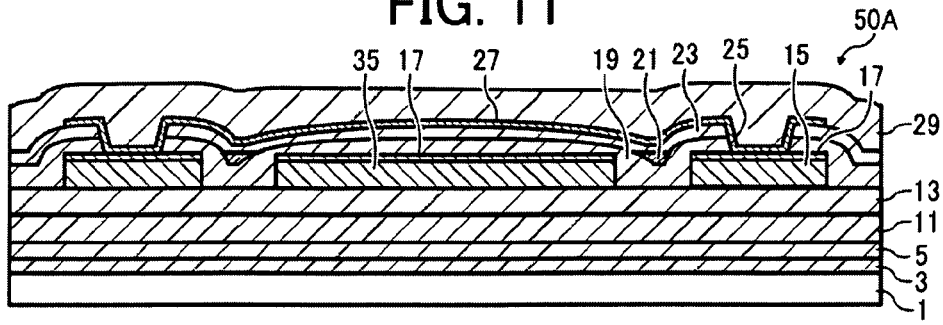
FIG. 11 is a sectional view of a semiconductor device according to another exemplary embodiment.

FIG. 11 is a sectional view of a semiconductor device 50A according to another exemplary embodiment. The semiconductor device 50A includes a metal film pattern 35.

The metal film pattern 35 as a second metal wiring layer is provided instead of the metal film pattern 7 (depicted in FIG. 3B). The other elements of the semiconductor device 50A are equivalent to those of the semiconductor device 50 (depicted in FIG. 3B).

Provision of the metal film pattern 35 causes a surface of the metal resistance element 27 to be curved. The TiN film 17 is formed on a surface of the metal film pattern 35.

In the semiconductor device 50A according to the present exemplary embodiment, when the resist film 33A (depicted in FIG. 6C) is exposed to light, so as to form the resist film pattern 33 (depicted in FIG. 6D) for defining a formation of the metal resistance element 27, the number of the interfaces reflecting the exposed light may be smaller than the number of the interfaces reflecting the exposed light in the semiconductor device 50. Therefore, variation of the standing wave generated in the resist film 33A may be reduced or prevented.

Figure 12:
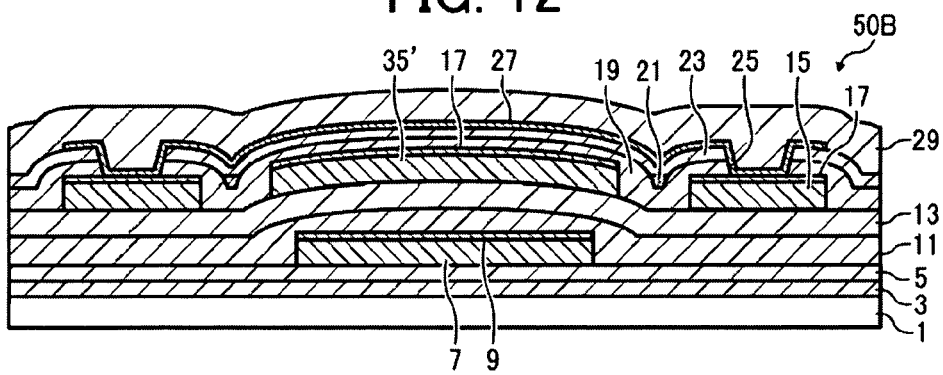
FIG. 12 is a sectional view of a semiconductor device according to yet another exemplary embodiment.

FIG. 12 is a sectional view of a semiconductor device 50B according to yet another exemplary embodiment. The semiconductor device 50B includes a metal film pattern 35'. The metal film pattern 35' is added to the second metal wiring layer of the semiconductor device 50 (depicted in FIG. 3B). The other elements of the semiconductor device 50B are equivalent to those of the semiconductor device 50.

Provision of the metal film pattern 35' causes the surface of the metal resistance element 27 to be curved. Due to the metal film pattern 7 provided below the metal film pattern 35', the metal film pattern 35' has curved upper and lower surfaces concave upwards along the longitudinal direction of the metal resistance element 27, thereby scattering the light reflected on the upper surface of the metal film pattern 35', so that variations in size of the metal resistance element 27 may be further reduced.

As illustrated in FIGS. 3B, 11, and 12, according to the above-described exemplary embodiments, provision of a curved surface to a metal resistance element (e.g., the metal resistance element 27) and provision of curved surfaces to the interfaces of insulating films (e.g., the TEOS films 11, 13, 19, and 23) below the metal resistance element may reduce variations in size of the metal resistance element. Further, reflection reducing effect due to a high melting point metal (e.g., the TiN film 9) provided on the surface of a metal wiring layer (e.g., the metal film pattern 7) below the metal resistance element, and standing wave reducing effect due to provision of a curved surface to a metal wiring layer (e.g., the metal film pattern 35') below the metal resistance element may also reduce variations in size of the metal resistance element.

Figure 13:
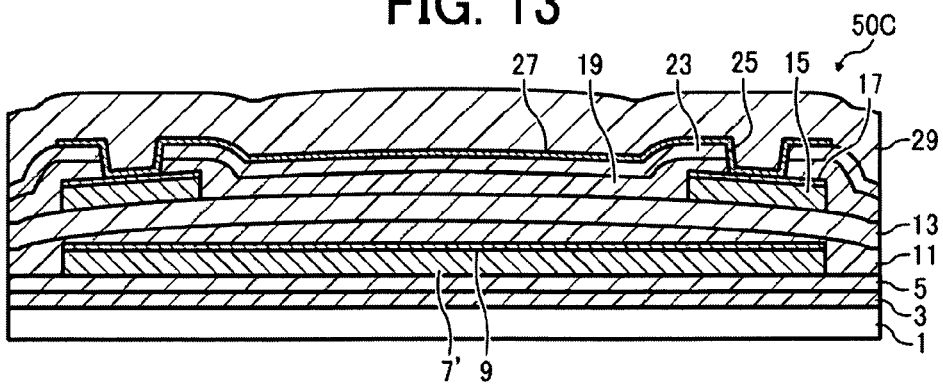
FIG. 13 is a sectional view of a semiconductor device according to yet another exemplary embodiment.

FIG. 13 is a sectional view of a semiconductor device 50C according to yet another exemplary embodiment. The semiconductor device 50C includes a metal film pattern 7'. The other elements of the semiconductor device 50C are equivalent to those of the semiconductor device 50 (depicted in FIG. 3B).

According to the above-described exemplary embodiments, the metal film pattern 7 (depicted in FIGS. 3B and 12) for causing the surface of the metal resistance element 27 (depicted in FIGS. 3B and 12) to be curved is formed in an area between the metal film patterns 15 (depicted in FIGS. 3B and 12) serving as electrodes of the metal resistance element 27. However, as illustrated in FIG. 13, the metal film pattern 7', which curves the surface of the metal resistance element 27, may be formed in areas under both of the metal film patterns 15 as well as the area between the metal film patterns 15.

Figure 14:
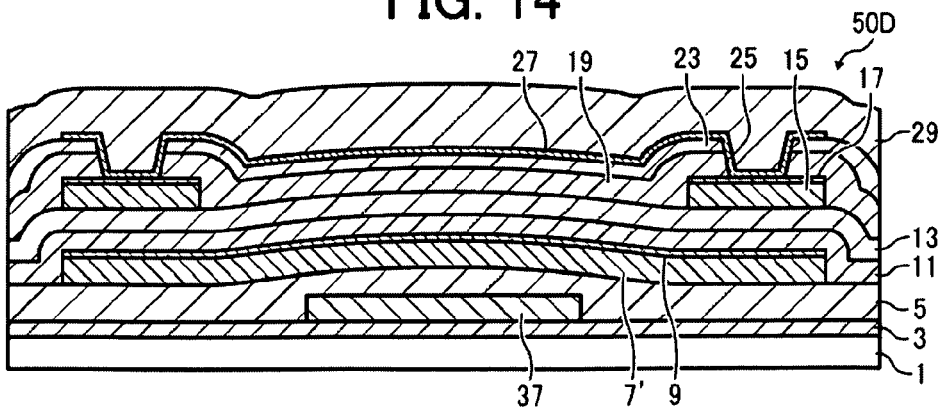
FIG. 14 is a sectional view of a semiconductor device according to yet another exemplary embodiment.

FIG. 14 is a sectional view of a semiconductor device 50D according to yet another exemplary embodiment. The semiconductor device 5D includes a polysilicon film pattern 37. The other elements of the semiconductor device 50D are equivalent to those of the semiconductor device 50C (depicted in FIG. 13).

As illustrated in FIG. 12, the semiconductor device 50B includes the metal film pattern 7 to provide the curved surface to the metal film pattern 35'. According to the present exemplary embodiment, the polysilicon film pattern 37 may be provided below the metal film pattern 7' to cause a surface of the metal film pattern 7' to be curved, as illustrated in FIG. 14.

Figure 15:
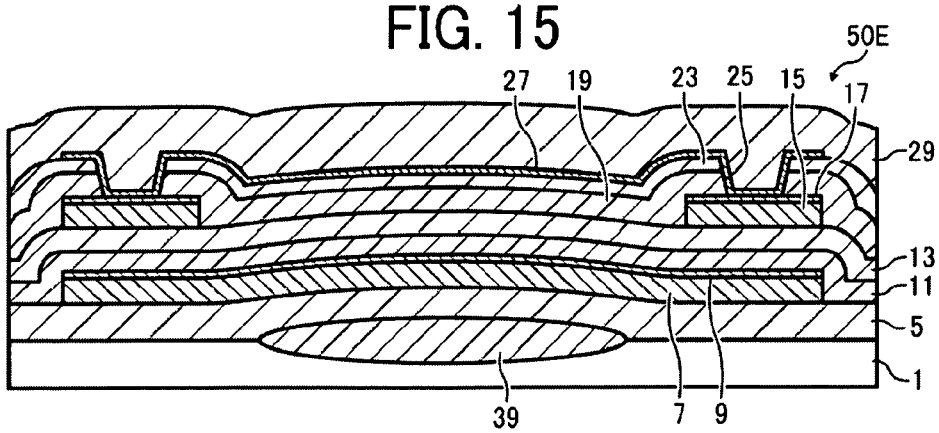
FIG. 15 is a sectional view of a semiconductor device according to yet another exemplary embodiment.

FIG. 15 is a sectional view of a semiconductor device 50E according to yet another exemplary embodiment. The semiconductor device 50E includes an element separation film pattern 39 instead of the element separation oxidation film 3 depicted in FIG. 13. The other elements of the semiconductor device 50E are equivalent to those of the semiconductor device 50C (depicted in FIG. 13).

The element separation film pattern 39 may be provided instead of the polysilicon film pattern 37 (depicted in FIG. 14).

Figure 16:
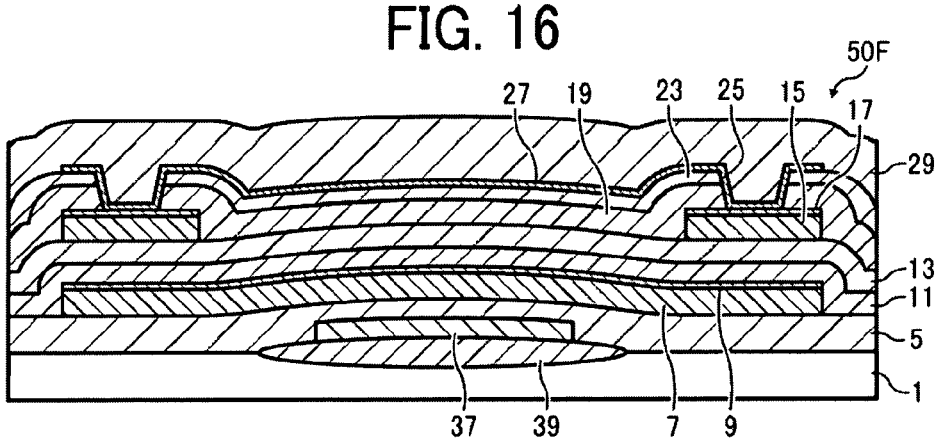
FIG. 16 is a sectional view of a semiconductor device according to yet another exemplary embodiment.

FIG. 16 is a sectional view of a semiconductor device 50F according to yet another exemplary embodiment. The semiconductor device 50F includes both the polysilicon film pattern 37 and the element separation film pattern 39. The other elements of the semiconductor device 50F are equivalent to those of the semiconductor device 50E (depicted in FIG. 15).

The polysilicon film pattern 37 may combine with the element separation film pattern 39 to form a curved pattern.

Figure 17:
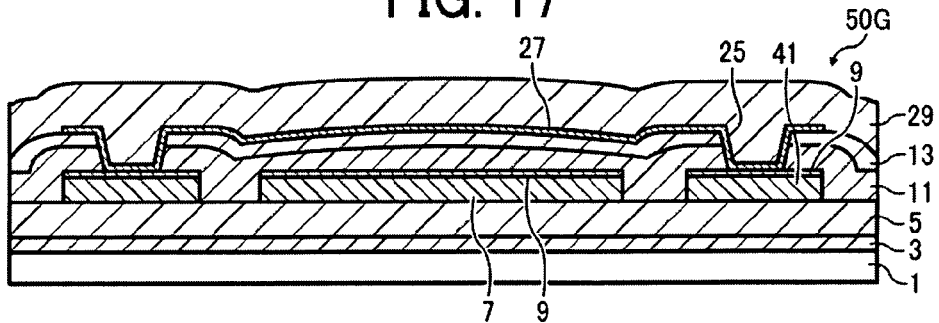
FIG. 17 is a sectional view of a semiconductor device according to yet another exemplary embodiment.

FIG. 17 is a sectional view of a semiconductor device SOG according to yet another exemplary embodiment. The semiconductor device 50G includes the silicon substrate 1, the element separation oxidation film 3, the interlayer insulating film 5, the metal film pattern 7, the TiN film 9, the TEOS films 11 and 13, the contact hole 25, the metal resistance element 27, the protection film 29, and a metal film pattern 41.

According to the above-described exemplary embodiments, the metal film pattern 15 (depicted in FIGS. 3B, and 11 to 16) serving as the second metal wiring layer is used as an electrode of the metal resistance element 27. However, according to the present exemplary embodiment, the metal film pattern 41 serving as a first metal wiring layer is used as an electrode of the metal resistance element 27. Therefore, provision of the metal film pattern 7 below the metal resistance element 27 may cause formation of the curved surface of the metal resistance element 27.

Figure 18:
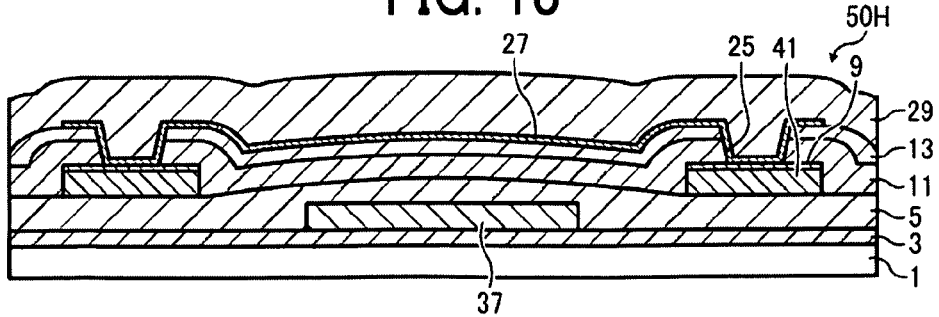
FIG. 18 is a sectional view of a semiconductor device according to yet another exemplary embodiment.

FIG. 18 is a sectional view of a semiconductor device 50H according to yet another exemplary embodiment. The semiconductor device 50H includes the polysilicon film pattern 37 instead of the metal film pattern 7 (depicted in FIG. 17). The other elements of the semiconductor device 50H are equivalent to those of the semiconductor device 50G (depicted in FIG. 17).

Figure 19:
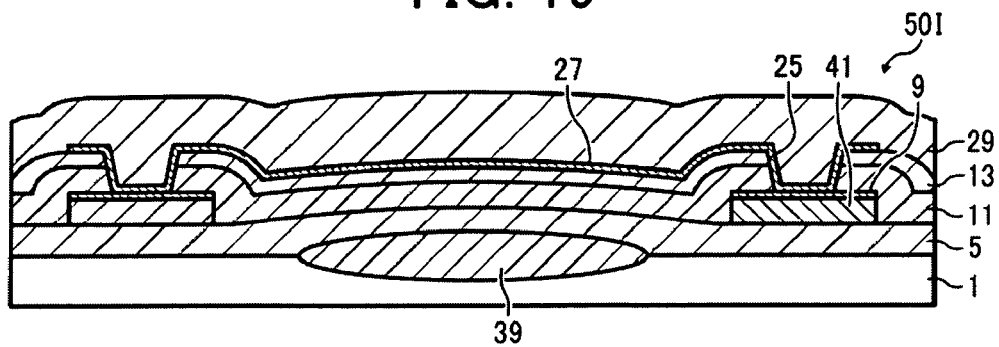
FIG. 19 is a sectional view of a semiconductor device according to yet another exemplary embodiment.

FIG. 19 is a sectional view of a semiconductor device 50I according to yet another exemplary embodiment. The semiconductor device 50I includes the element separation film pattern 39 instead of the element separation oxidation film 3 and the polysilicon film pattern 37 (depicted in FIG. 18). The other elements of the semiconductor device 50I are equivalent to those of the semiconductor device 50H (depicted in FIG. 18).

Alternatively, two or three of the metal film pattern 7, the polysilicon film pattern 37, and the element separation film pattern 39 may combine with each other, so as to provide a curved surface to the metal resistance element 27.

Figure 20:
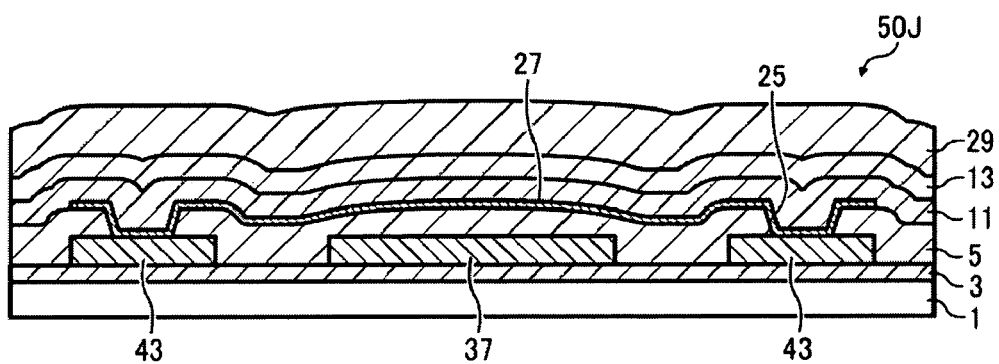
FIG. 20 is a sectional view of a semiconductor device according to yet another exemplary embodiment.

FIG. 20 is a sectional view of a semiconductor device 50J according to yet another exemplary embodiment. The semiconductor device 50J includes the silicon substrate 1, the element separation oxidation film 3, the interlayer insulating film 5, the TEOS films 11 and 13, the contact hole 25, the metal resistance element 27, the protection film 29, the polysilicon film pattern 37, and a polysilicon film pattern 43.

When the polysilicon film pattern 43 is used as an electrode of the metal resistance element 27, provision of the polysilicon film pattern 37 below the metal resistance element 27 may cause formation of the curved surface of the metal resistance element 27.

Figure 21:
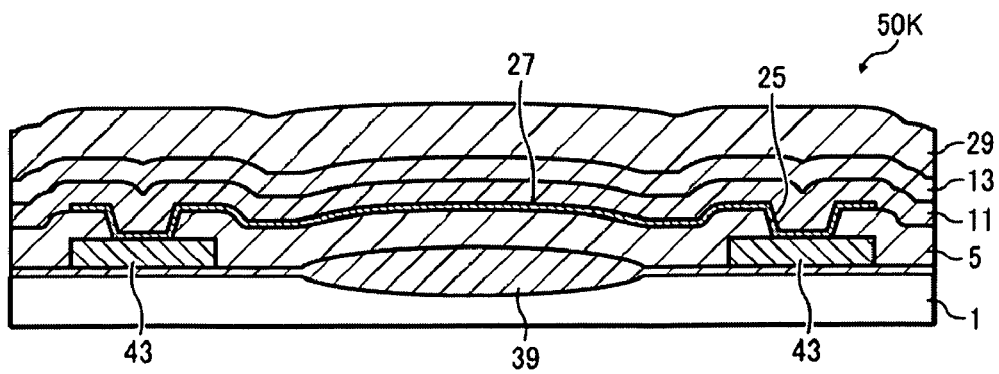
FIG. 21 is a sectional view of a semiconductor device according to yet another and further exemplary embodiment.

FIG. 21 is a sectional view of a semiconductor device 50K according to yet another exemplary embodiment. The semiconductor device 50K includes the silicon substrate 1, the interlayer insulating film 5, the TEOS films 11 and 13, the contact hole 25, the metal resistance element 27, the protection film 29, the element separation film pattern 39, and the polysilicon film pattern 43.

In the exemplary embodiments of FIGS. 20 and 21, the foundation insulating film includes the insulating film 5.

Alternatively, combination of the polysilicon film pattern 37 and the element separation film pattern 39 also may provide the curved surface to the metal resistance element 27.

Although examples and exemplary embodiments have been described above with respect to semiconductor device 50 (depicted in FIG. 3B) and the semiconductor devices 50A to 50K (depicted in FIGS. 11 to 21) having a single-layer metal wiring structure or a double-layer metal wiring structure, the above-described examples and exemplary embodiments also may be adapted to a semiconductor device with a three-or-more-layer metal wiring structure. Further, in the semiconductor device with the three-or-more-layer metal wiring structure, formation of a curved surface of a pattern providing a curved surface to a metal resistance element may be achieved by providing a pattern in a lower layer, which may be selected from an arbitrary combination of patterns (e.g., the metal film patterns 7 and 7', the polysilicon film pattern 37, and the element separation film pattern 39). Moreover, according to the above-described exemplary embodiments, the metal wiring (e.g., the metal film pattern 15 depicted in FIGS. 3B, 11 to 16, the metal film pattern 41 depicted in FIGS. 17 to 19, and the polysilicon film pattern 43 depicted in FIGS. 20 and 21) provided lower than a metal resistance element (e.g., the metal resistance element 27) is used as the electrode of the metal resistance element. However, the metal wiring provided above the metal resistance element may be used as the electrode of the metal resistance element.

As illustrated in FIG. 3B, according to the above-described exemplary embodiments, a foundation insulating film (e.g., the TEOS film 23) provided under a metal resistance element (e.g. the metal resistance element 27) has a single upwardly concave curved surface constituting not less than about 40 percent, or preferably not less than about 66 percent of an upper surface of the foundation insulating film between contacts (e.g., the contact holes 25) in a longitudinal direction of the metal resistance element. The metal resistance element likewise has an upwardly concave curved surface constituting not less than about 40 percent, or preferably not less than about 66 percent of upper and lower surfaces of the metal resistance element between the contacts in the longitudinal direction of the metal resistance element. Therefore, during exposure processing by a photo engraving technique for defining a formation of the metal resistance element, the curved surfaces may cause light reflected on upper and lower surfaces of a metal film (e.g., the metal film pattern 7) for forming the metal resistance element to scatter, thereby preventing a standing wave generated by reflected light and incident light in a resist film (e.g., the resist film 33A depicted in FIG. 6C), and decreasing variations in size of the metal resistance element.

The shape, arrangement, number, material, size, and the like, are not limited to the examples of the above-described exemplary embodiments, and do not exclude a different shape, arrangement, number, material, size, and the like.

Numerous additional modifications and variations are possible in light of the above teachings. It is therefore to be understood that within the scope of the appended claims, the disclosure of this patent specification may be practiced otherwise than as specifically described herein. For example, elements and/or features of different illustrative embodiments may be combined with each other and/or substituted for each other within the scope of this disclosure and appended claims.

This patent specification is based on Japanese Patent Application No. 2007-087778 filed on Mar. 29, 2007 in the Japan Patent Office, the entire contents of which are incorporated herein by reference.

What is claimed is:

1. A semiconductor device, comprising:
   a semiconductor substrate;
   a foundation insulating film formed over the semiconductor substrate;
   a metal resistance element formed on the foundation insulating film; and
   contacts formed at both ends of the metal resistance element in a longitudinal direction of the metal resistance element and connected to the metal resistance element,
   wherein the foundation insulating film comprises a single upwardly concave curved surface constituting not less than about 40 percent of an upper surface of the metal resistance element between the contacts in the longitudinal direction of the metal resistance element, and
   wherein the curved surface of the foundation insulating film causes the metal resistance element to comprise a single upwardly concave curved surface constituting not less than about 40 percent of upper and lower surfaces of the metal resistance element between the contacts in the longitudinal direction of the metal resistance element.

2. The semiconductor device according to claim 1, further comprising:
   a first metal film pattern provided below the foundation insulating film and configured to cause the curved surface of the foundation insulating film to be formed thereover.

3. The semiconductor device according to claim 2,
   wherein the first metal film pattern comprises high melting point metal.

4. The semiconductor device according to claim 2,
   wherein high melting point metal is provided on an upper surface of the first metal film pattern.

5. The semiconductor device according to claim 2,
   wherein the first metal film pattern comprises a single upwardly concave curved surface constituting at least a part of upper and lower surfaces of the first metal film pattern.

6. The semiconductor device according to claim 2, wherein at least a portion of the foundation insulation film is formed on the first metal film pattern.

7. The semiconductor device according to claim 2, further comprising:
   an additional metal film pattern provided between the foundation insulating film and the first metal film pattern,
   wherein the additional metal film pattern comprises a single upwardly concave curved surface in the longitudinal direction of the metal resistance element.

8. The semiconductor device according to claim 7, wherein said contacts are formed over the first metal film pattern.

9. The semiconductor device according to claim 2, further comprising:

a polysilicon film pattern formed over the semiconductor substrate, wherein the first metal film pattern is formed over the polysilicon film pattern, and comprises a single upwardly concave curved surface in the longitudinal direction of the metal resistance element.

10. The semiconductor device according to claim 9, wherein said contacts are formed over the first metal film pattern.

11. The semiconductor device according to claim 9, wherein at least a portion of the foundation insulation film is formed on the polysilicon film pattern.

12. The semiconductor device according to claim 2, further comprising:

an element separation film pattern formed over the semiconductor substrate and comprising a single upwardly concave curved surface in the longitudinal direction of the metal resistance element, wherein the first metal film pattern is formed over the element separation film pattern, and comprises a single upwardly concave curved surface in the longitudinal direction of the metal resistance element.

13. The semiconductor device according to claim 12, wherein said contacts are formed over the first metal film pattern.

14. The semiconductor device according to claim 12, wherein at least a portion of the foundation insulation film is formed on the element separation film pattern.

15. The semiconductor device according to claim 12, further comprising:

a polysilicon film pattern formed on the element separation film pattern, wherein the first metal film pattern is formed over the polysilicon film pattern, and comprises a single upwardly concave curved surface in the longitudinal direction of the metal resistance element.

* * * * *

UNITED STATES PATENT AND TRADEMARK OFFICE
CERTIFICATE OF CORRECTION

PATENT NO. : 7,855,434 B2  
APPLICATION NO. : 12/055947  
DATED : December 21, 2010  
INVENTOR(S) : Kimihiko Yamashita Page 1 of 1

It is certified that error appears in the above-identified patent and that said Letters Patent is hereby corrected as shown below:

Title Page item 30

Insert the Foreign Priority Application Data on the cover page of the patent, containing the following:

--March 29, 2007 (JP) .........2007-087778--

Signed and Sealed this
Seventeenth Day of May, 2011

David J. Kappos
*Director of the United States Patent and Trademark Office*